US008823171B2

(12) United States Patent
Cho

(10) Patent No.: US 8,823,171 B2
(45) Date of Patent: Sep. 2, 2014

(54) SEMICONDUCTOR PACKAGE, SEMICONDUCTOR DEVICE HAVING THE SAME, AND METHOD OF MANUFACTURING THE SAME

(71) Applicant: Samsung Electronics Co., Ltd., Suwon-si (KR)

(72) Inventor: Yun-Rae Cho, Hwasung (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/889,343

(22) Filed: May 7, 2013

(65) Prior Publication Data

US 2014/0008789 A1 Jan. 9, 2014

(30) Foreign Application Priority Data

Jul. 6, 2012 (KR) .................. 10-2012-0073956

(51) Int. Cl.
*H01L 23/498* (2006.01)
*H01L 25/065* (2006.01)

(52) U.S. Cl.
CPC ...... *H01L 23/49811* (2013.01); *H01L 25/0657* (2013.01); *H01L 2224/81191* (2013.01); *H01L 2225/1058* (2013.01); *H01L 2224/16225* (2013.01); *H01L 2224/73253* (2013.01); *H01L 2924/15311* (2013.01); *H01L 2225/06513* (2013.01); *H01L 2225/1023* (2013.01); *H01L 2224/81192* (2013.01); *H01L 2224/92242* (2013.01); *H01L 2924/15331* (2013.01); *H01L 2224/16145* (2013.01); *H01L 2924/18161* (2013.01); *H01L 23/49822* (2013.01); *H01L 2224/32225* (2013.01); *H01L 2225/06541* (2013.01)
USPC ........................................... 257/737

(58) Field of Classification Search
USPC ................... 257/737; 438/128, 106
See application file for complete search history.

(56) References Cited

U.S. PATENT DOCUMENTS

| 7,151,317 | B2 | 12/2006 | Chao et al. |
|---|---|---|---|
| 7,531,441 | B2 | 5/2009 | Kado et al. |
| 8,064,222 | B2 | 11/2011 | Nishio et al. |
| 8,124,453 | B2 | 2/2012 | Sun et al. |
| 2004/0212069 | A1* | 10/2004 | Chen et al. ............. 257/686 |
| 2005/0199991 | A1 | 9/2005 | Chao et al. |
| 2006/0189031 | A1 | 8/2006 | Kado et al. |
| 2008/0203554 | A1 | 8/2008 | Nishio et al. |
| 2008/0258288 | A1 | 10/2008 | Park et al. |
| 2009/0200651 | A1 | 8/2009 | Kung et al. |

(Continued)

FOREIGN PATENT DOCUMENTS

| JP | 2004356138 A | 12/2004 |
|---|---|---|
| JP | 2010098225 A | 4/2010 |
| KR | 100885918 B1 | 2/2009 |
| KR | 20090097694 A | 9/2009 |

*Primary Examiner* — Thao P Le
(74) *Attorney, Agent, or Firm* — Renaissance IP Law Group LLP

(57) ABSTRACT

Provided are a semiconductor package, a semiconductor device provided with the same, and a method of fabricating the same. The semiconductor package may include a package substrate including a central region and a peripheral region, a first semiconductor chip provided on the package substrate, a first connection pattern provided on the central region of the package substrate to connect the package substrate electrically to the first semiconductor chip, at least one second semiconductor chip provided on the peripheral region of the package substrate and between the package substrate and the first semiconductor chip, and a second connection pattern provided on the peripheral region of the package substrate to connect the first semiconductor chip electrically to the second semiconductor chip.

13 Claims, 14 Drawing Sheets

(56) References Cited

U.S. PATENT DOCUMENTS

| | | |
|---|---|---|
| 2009/0230548 A1 | 9/2009 | Park et al. |
| 2011/0143499 A1 | 6/2011 | Sun et al. |
| 2011/0193206 A1 | 8/2011 | Galera et al. |
| 2012/0038064 A1* | 2/2012 | Camacho et al. ............. 257/777 |
| 2013/0168798 A1* | 7/2013 | Chang et al. .................. 257/467 |
| 2013/0320567 A1* | 12/2013 | Thacker et al. ............... 257/777 |

* cited by examiner

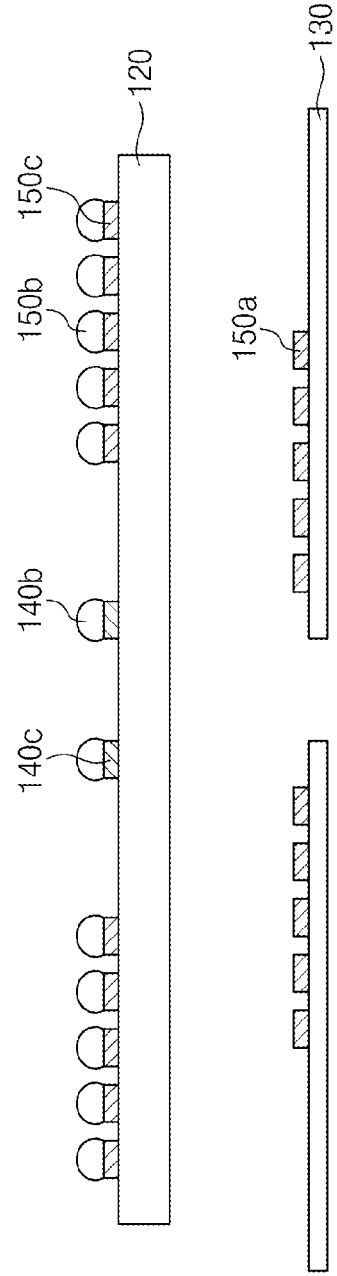
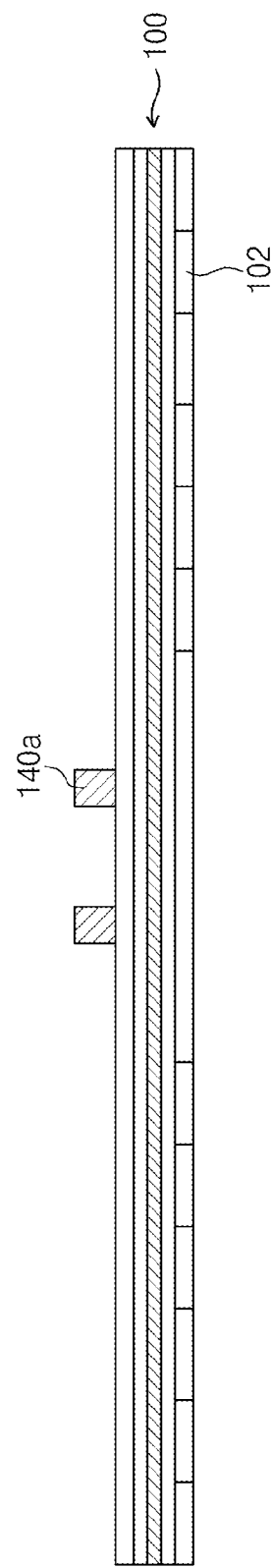

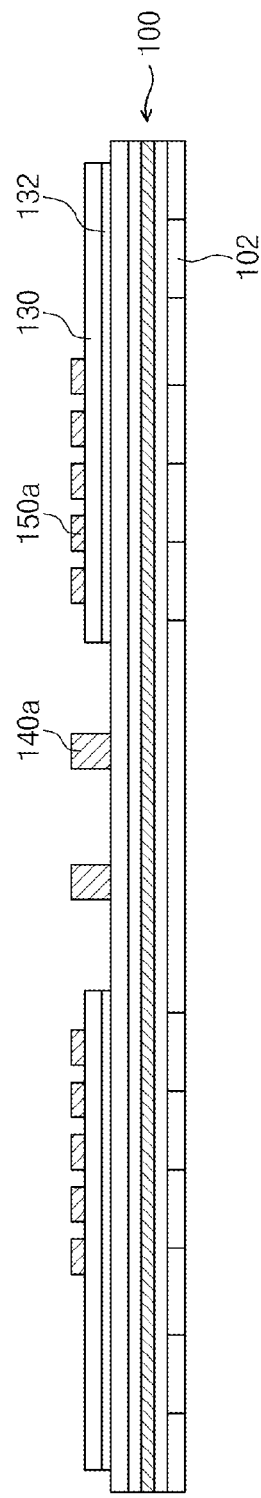
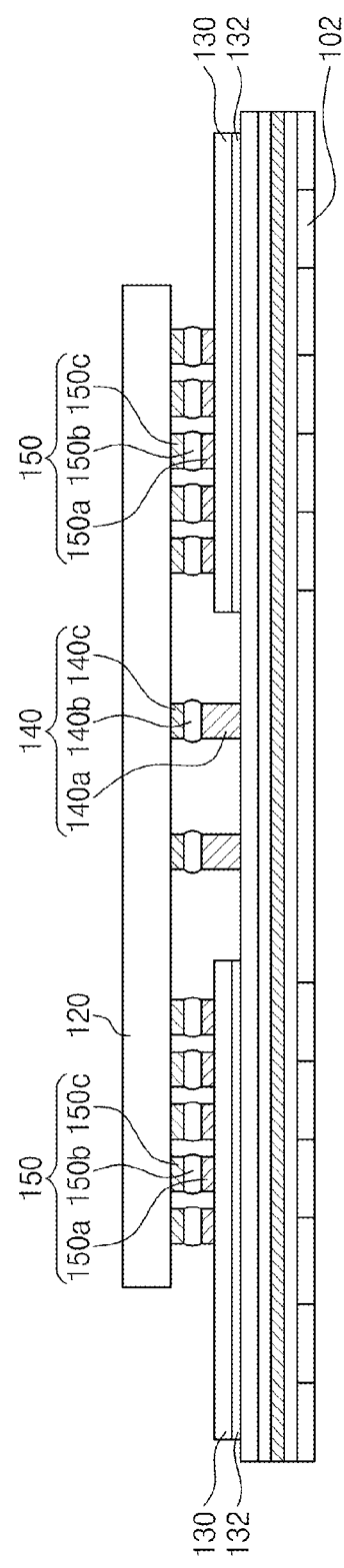

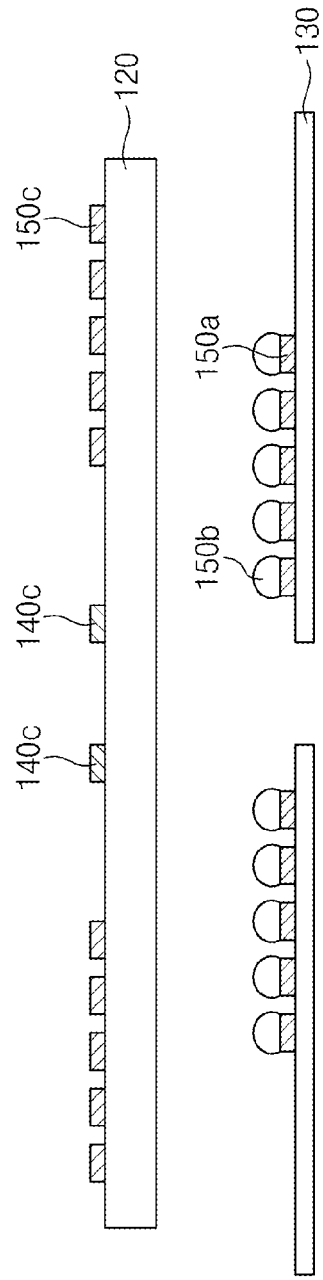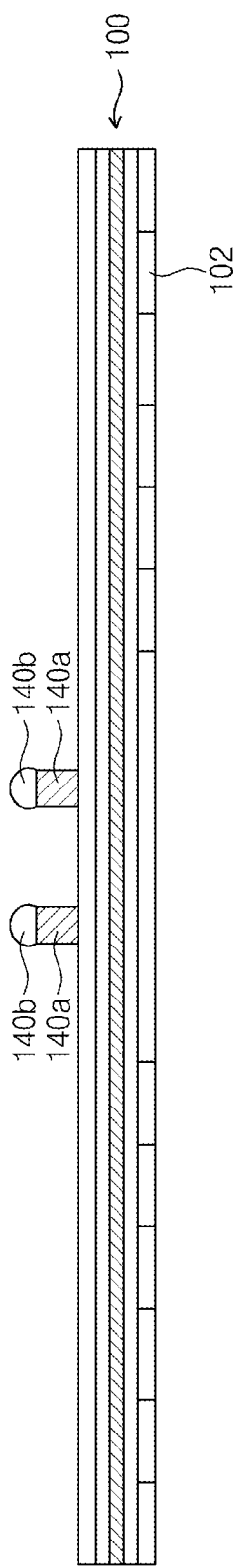

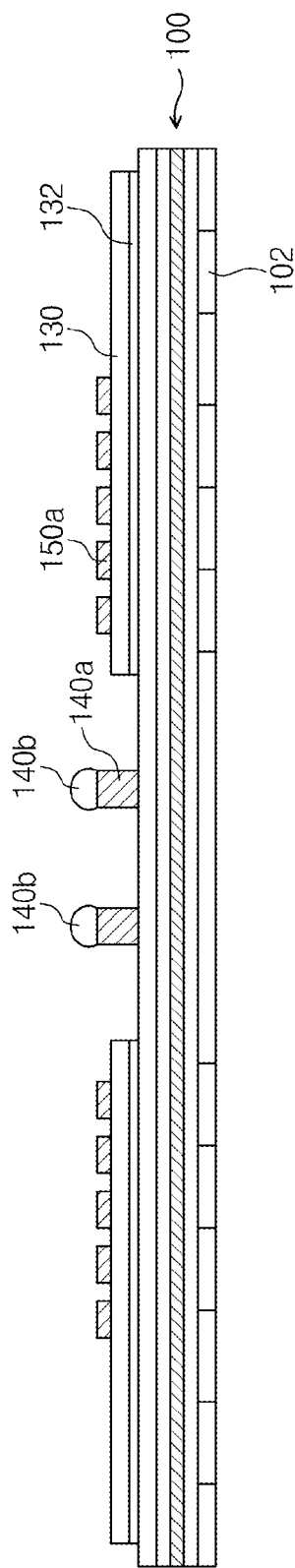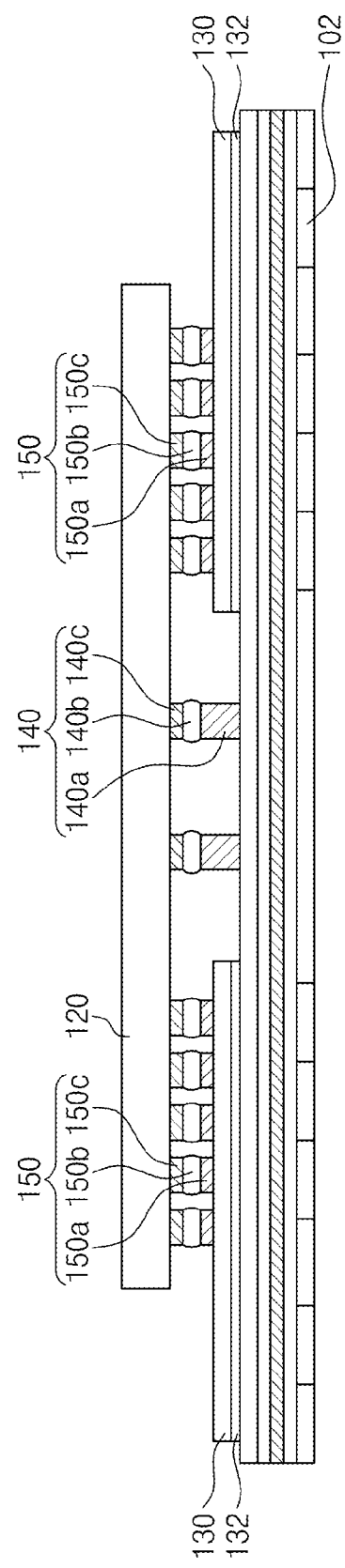

SEMICONDUCTOR PACKAGE, SEMICONDUCTOR DEVICE HAVING THE SAME, AND METHOD OF MANUFACTURING THE SAME

CROSS-REFERENCE TO RELATED APPLICATIONS

This U.S. non-provisional patent application claims priority under 35 U.S.C. §119 to Korean Patent Application No. 10-2012-0073956, filed on Jul. 6, 2012, in the Korean Intellectual Property Office, the entire contents of which are hereby incorporated by reference.

BACKGROUND

Example embodiments of the inventive concept generally relate to a semiconductor package.

Semiconductor devices can be generally classified into a memory device for storing data, a logic device for processing data, and a hybrid device capable of performing various memory storage and data processing functions.

In recent years, demands for high integration and high performance semiconductor devices are increasing. However, it has become harder to realize the highly-integrated semiconductor devices due to the increasing difficulty of manufacturing highly-integrated semiconductor devices. Numerous studies have been done to develop new technologies for increasing an integration density of the semiconductor device.

SUMMARY

Example embodiments of the inventive concept provide a semiconductor package configured to have an increased integration density.

Other example embodiments of the inventive concept provide a semiconductor device provided with the semiconductor package.

Still other example embodiments of the inventive concept provide a method of fabricating the semiconductor package.

According to example embodiments of the inventive concepts, a semiconductor package may include a package substrate including a central region and a peripheral region, a first semiconductor chip on the package substrate, a first connection pattern on the central region of the package substrate to connect the package substrate electrically to the first semiconductor chip, at least one second semiconductor chip on the peripheral region of the package substrate and between the package substrate and the first semiconductor chip, and a second connection pattern on the peripheral region of the package substrate to connect the first semiconductor chip electrically to the second semiconductor chip.

In example embodiments, the first connection pattern may include a first conductive post on the package substrate, a second conductive post on the first semiconductor chip, and a first bump between the first and second conductive posts.

In example embodiments, the first conductive post has a thickness that may be substantially equivalent to or greater than thickness of the second conductive post.

In example embodiments, the second connection pattern may include a third conductive post on the first semiconductor chip, a fourth conductive post on the second semiconductor chip, and a second bump between the third and fourth conductive posts.

In example embodiments, the first conductive post has a top surface that may be substantially coplanar with a top surface of the third conductive post.

In example embodiments, the first bump may be provided at substantially the same level as that of the second bump and has substantially the same shape as that of the second bump.

In example embodiments, the at least one second semiconductor chip may include a plurality of second semiconductor chips, which may be horizontally spaced apart from each other, and each of which may be provided on the peripheral region of the package substrate.

In example embodiments, the package may further include a third semiconductor chip on the first semiconductor chip, and a third connection pattern connecting the first semiconductor chip electrically to the third semiconductor chip.

In example embodiments, the first semiconductor chip may include a through electrode, which penetrates the first semiconductor chip to connect the second connection pattern electrically to the third connection pattern.

In example embodiments, the first semiconductor chip may include a through electrode, which penetrates the first semiconductor chip to connect the first connection pattern electrically to the third connection pattern.

According to example embodiments of the inventive concepts, a semiconductor device may include a first semiconductor package including a first package substrate, a first master chip connected to the first package substrate via a first connection pattern, and a first slave chip between the first package substrate and the first master chip and connected to the first master chip via a second connection pattern, a second semiconductor package including a second package substrate, a second master chip connected to the second package substrate via a third connection pattern, and a second slave chip between the second package substrate and the second master chip and connected to the second master chip via a fourth connection pattern, and a connecting portion connecting the first semiconductor package electrically to the second semiconductor package.

In example embodiments, the first connection pattern may be provided on a central region of the first package substrate, the second connection pattern may be provided on a peripheral region of the first package substrate, the third connection pattern may be provided on a central region of the second package substrate, and the fourth connection pattern may be provided on a peripheral region of the second package substrate.

In example embodiments, each of the first and third connection patterns may include a first conductive post on the first or second package substrate, a second conductive post on the first or second master chip, and a bump between the first and second conductive posts.

According to example embodiments of the inventive concepts, a method of fabricating a semiconductor package may include forming a first conductive post on a central region of the package substrate, mounting a slave chip provided with a second conductive post on a peripheral region of the package substrate, forming a third conductive post and a first bump on a central region of the master chip and a fourth conductive post and a second bump on a peripheral region of the master chip, mounting the master chip on the package substrate, and forming a first connection pattern including the first bump and the third conductive post electrically connected to each other on the first conductive post and a second connection pattern including the second bump and the fourth conductive post electrically connected to each other on the second conductive post.

In example embodiments, the first to fourth conductive posts may be formed using a copper-plating process.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIGS. 8A through 8E are cross-sectional views illustrating a fabrication method of a semiconductor package according to example embodiments of the inventive concept.

FIGS. 9A through 9D are cross-cross-sectional views illustrating a fabrication method of a semiconductor package according to another embodiment of the inventive concept.

Figure 1:
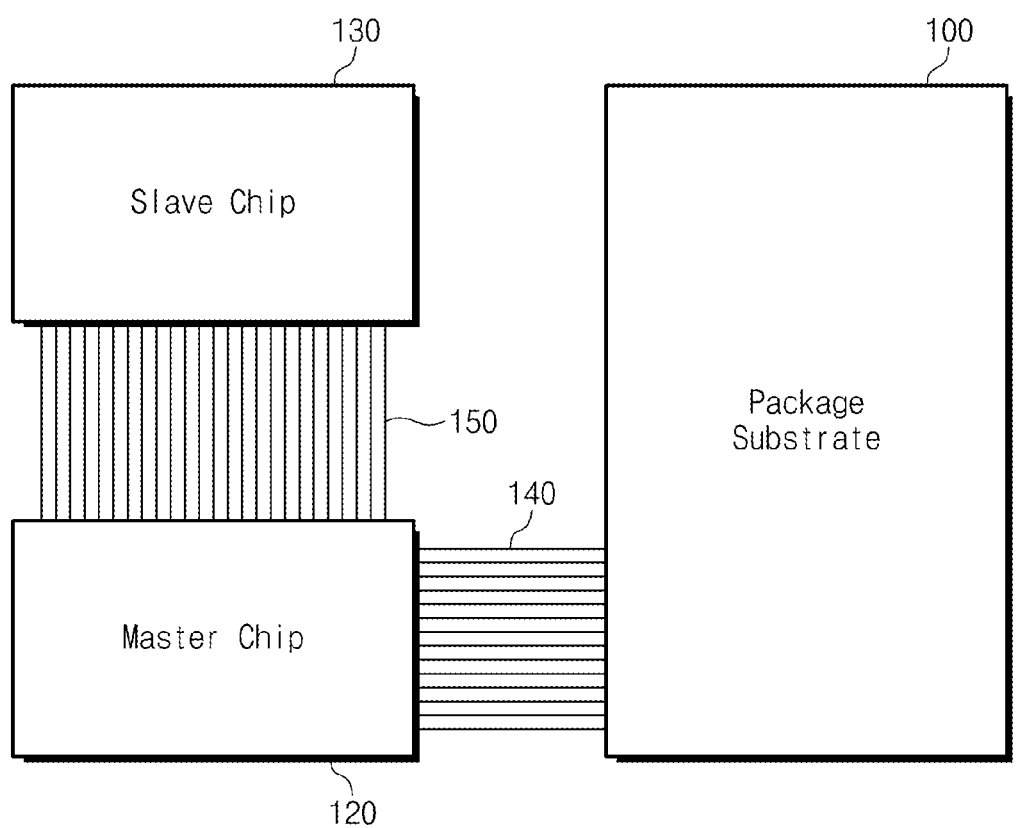
FIG. 1 is a schematic diagram illustrating an internal connection of a semiconductor package according to example embodiments of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

[Semiconductor Package: Example Embodiment]

Figure 2:
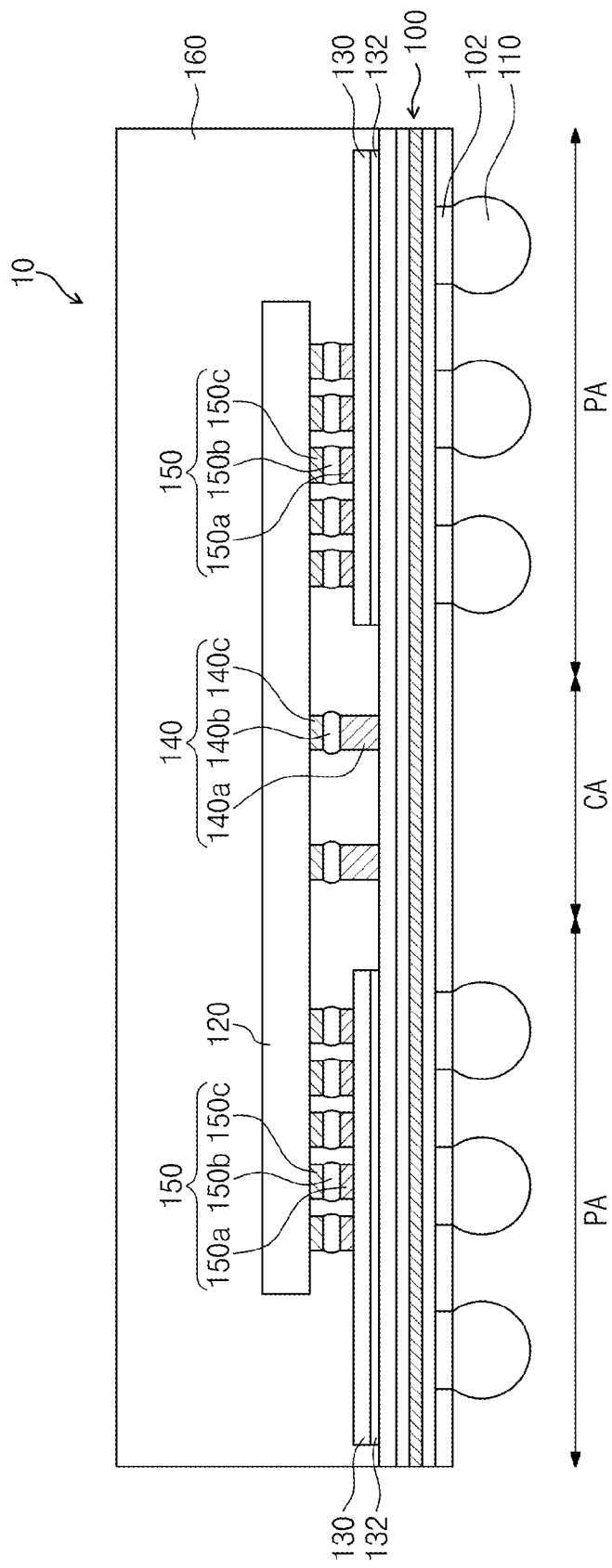
FIG. 2 is a cross-sectional view illustrating a semiconductor package according to example embodiments of the inventive concept.

FIG. 1 is a schematic diagram illustrating an internal connection of a semiconductor package according to example embodiments of the inventive concept. FIG. 2 is a cross-sectional view illustrating a semiconductor package according to example embodiments of the inventive concept, and FIG. 3 is a cross-sectional view illustrating a semiconductor package according to other example embodiments of the inventive concept.

Figure 3:
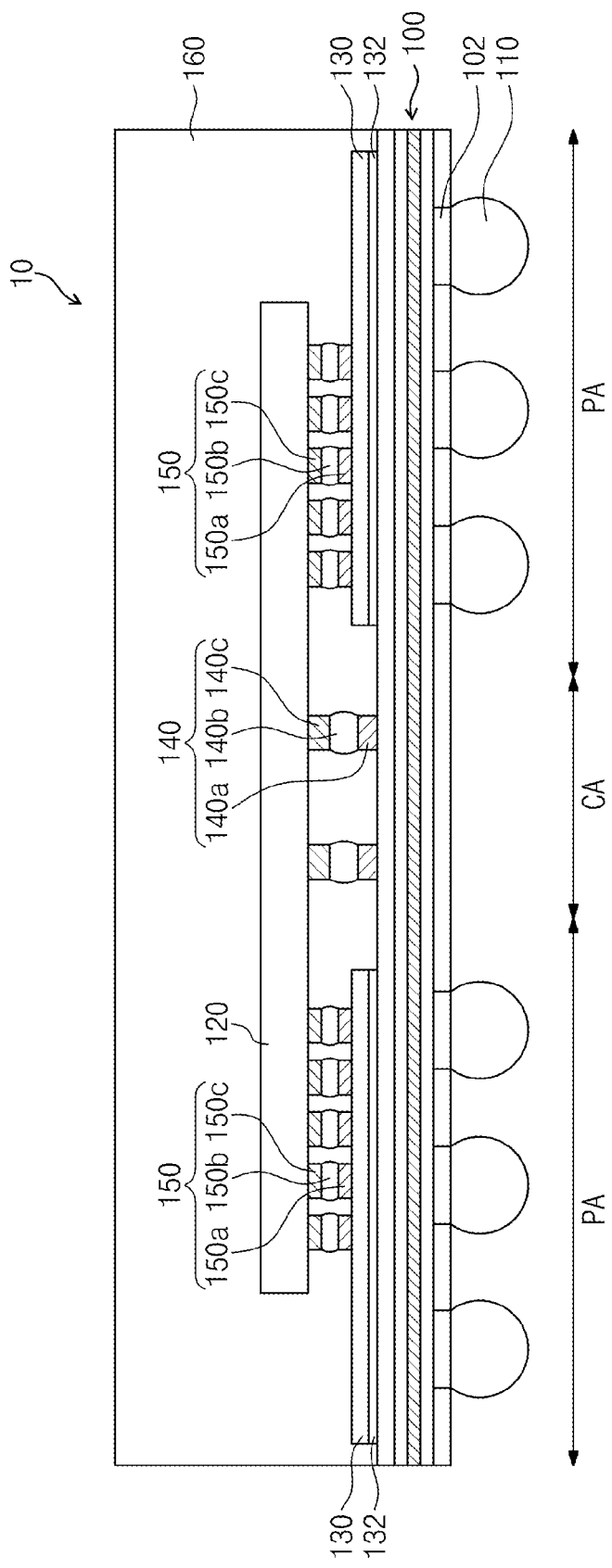
FIG. 3 is a cross-sectional view illustrating a semiconductor package according to other example embodiments of the inventive concept.

Referring to FIGS. 1 through 3, a semiconductor package 10 may include a package substrate 100, first and second semiconductor chips 120 and 130 mounted on the package substrate 100, and first and second connection patterns 140 and 150.

The package substrate 100 may be a printed-circuit board. The package substrate 100 may also have a different structure. For example, the package substrate 100 may be formed of a film structure with necessary interconnects within or on a film base formed of an organic material. The package substrate 100 may include a central region CA and a peripheral region PA adjacent to the central region CA. The first and second semiconductor chips 120 and 130 may be mounted on a surface (hereinafter, referred to as a "top surface") of the package substrate 100. The first semiconductor chip 120 may also be referred to as a master chip and the second semiconductor chip 130 may be referred to as a slave chip as illustrated in FIG. 1. Pads 102 may be formed on the other surface of the package substrate 100, and outer terminals 110 may be provided on the pads 102, respectively. In example embodiments, the outer terminals 110 may beconductive balls such as solder balls.

The first semiconductor chip 120 may be disposed on the package substrate 100 to face the top surface of the package substrate 100. In some embodiments, the first semiconductor chip 120 may be spaced apart from the package substrate 100. The first semiconductor chip 120 may fully overlap the central region CA of the package substrate 100 and partially overlap the peripheral region PA of the package substrate 100. For example, the first semiconductor chip 120 may be substantially concentric with the package substrate 100. In addition, the first semiconductor chip 120 may include pads (not shown) provided on a surface thereof facing the package substrate 100.

The second semiconductor chip 130 may be disposed between the package substrate 100 and the first semiconductor chip 120. The second semiconductor chip 130 may be provided on the peripheral region PA of the package substrate 100. According to some aspects of the inventive concept, the second semiconductor chip 130 may be attached on the package substrate 100 using an attaching element 132 (e.g., a die attach film (DAF) or die attach paste). Pads (not shown) may be provided on the other surface of the second semiconductor chip 130, opposite the package substrate 100.

In example embodiments, a pair of the second semiconductor chips 130 may be mounted on the package substrate 100. The pair of the second semiconductor chips 130 may be spaced apart from each other in a horizontal direction. However, example embodiments of the inventive concept may not be limited to the afore-described embodiment, in which the number of the second semiconductor chips 130 is two.

The connection structures may include the first connection patterns 140, at least one of which may connect the package substrate 100 to the first semiconductor chip 120, and the second connection patterns 150, at least one of which may connect the first semiconductor chip 120 to the second semiconductor chip 130.

The first connection patterns 140 may be disposed on the central region CA of the package substrate 100. At least one of the first connection patterns 140 may include a first conductive post 140a adjacent to the package substrate 100, a second conductive post 140c adjacent to the first semiconductor chip 120, and a first bump 140b electrically connecting the first and second conductive posts 140a and 140c. According to some aspects of the inventive concept, at least one of the first and second conductive posts 140a and 140c may include copper, e.g., a layer of copper. Example embodiments of the inventive concept may not be limited to the afore-described embodiment, in which the number of the first connection patterns 140 is two.

The second connection pattern 150 may be provided on the peripheral region PA of the package substrate 100. The second connection pattern 150 may include a third conductive post 150a adjacent to the second semiconductor chip 130, a fourth conductive post 150c adjacent to the first semiconductor chip 120, and a second bump 150b electrically interconnecting the third and fourth conductive posts 150a, 150c. According to some aspects of the inventive concept, at least one of the third and fourth conductive posts 150a and 150c may include copper, e.g., a layer of copper. Example embodiments of the inventive concept may not be limited to the afore-described embodiment, in which the number of the second connection pattern 150 is ten.

According to example embodiments of the inventive concept shown in FIG. 2, the first and second bumps 140b and 150b may be formed to have substantially the same height or thickness. In addition, the first and second bumps 140b and 150b may be substantially equivalent or similar to each other in terms of size or shape thereof. In contrast, the first conductive post 140a may have a different height or thickness from that of the second conductive post 140c. For example, the first conductive post 140a may have a thickness greater than that of the second conductive post 140c. A total thickness of the first conductive post 140a may be substantially equivalent to a sum of thicknesses of the DAF 132, the second semiconductor chip 130, and the third conductive post 150a. Further, the second conductive post 140c may have substantially the same height or thickness as that of the fourth conductive post 150c.

A surface of the first conductive post 140a adjacent to the first bump 140b may be coplanar with a surface, adjacent to the second bump 150b, of the third conductive post 150a, and this enables to form the first and second bumps 140b and 150b using the same process and facilitate the overall fabrication process of the semiconductor package 10.

According to other example embodiments of the inventive concept shown in FIG. 3, the first and second bumps 140b and 150b may be formed to have different thicknesses or heights from each other. In example embodiments, the first conductive post 140a may have substantially the same thickness as that of the second conductive post 140c. In other example embodiments, although not illustrated, the first and second conductive posts 140a and 140c may be formed to have substantially different thicknesses from each other.

Referring to FIGS. 2 and 3, if the number of the second semiconductor chips 130 is two, the first connection pattern 140 may be provided on the central region CA of the package substrate 100 and the second semiconductor chips 130 may be provided spaced apart from each other with the first connection pattern 140 interposed therebetween. Due to the structure of the first connection pattern 140, at least one of the second semiconductor chips 130 may be disposed on the peripheral region PA of the package substrate 100 and limitation on its size can be relieved.

Referring back to FIG. 1, the first connection pattern 140 may connect the first semiconductor chip 120 directly to the package substrate 100. The second semiconductor chip 130 may be connected to the first semiconductor chip 120 using the second connection pattern 150, and thus, the second semiconductor chip 130 may be electrically connected to the package substrate 100 via the first semiconductor chip 120. In example embodiments, the first semiconductor chip 120 may include logic cells and/or memory cells, while the second semiconductor chip 130 may include only memory cells. In this case, the first semiconductor chip 120 may serve as a master chip, and the second semiconductor chip 130 may serve as a slave chip. In other words, the slave chip 130 may be electrically connected to the master chip 120, and signal communication between the slave chip 130 and the package substrate 100 may be controlled by the master chip 120. With the above connection structure, the semiconductor package 10 can include more memory cells thereon and have an increased operating speed.

The semiconductor package 10 may further include a protection element 160, which may be used to protect the package substrate 100 and the first and second semiconductor chips 120 and 130 against an external stress. The protection element 160 may be a molding compound or an under-fill layer or underfill material.

[Semiconductor Package: Second Embodiment]

Figure 4:
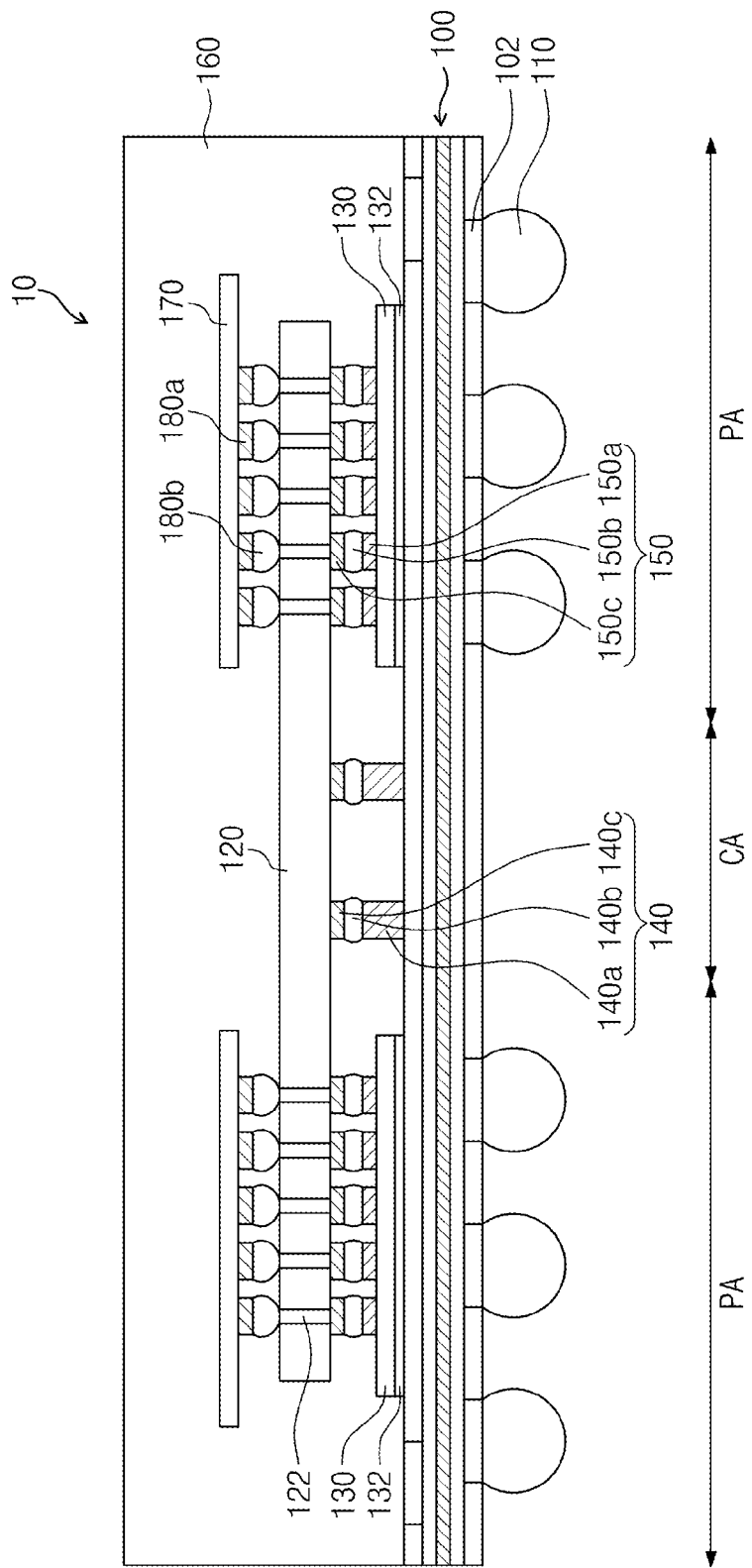
FIG. 4 is a cross-sectional view illustrating a semiconductor package according to still other example embodiments of the inventive concept.
Figure 5:
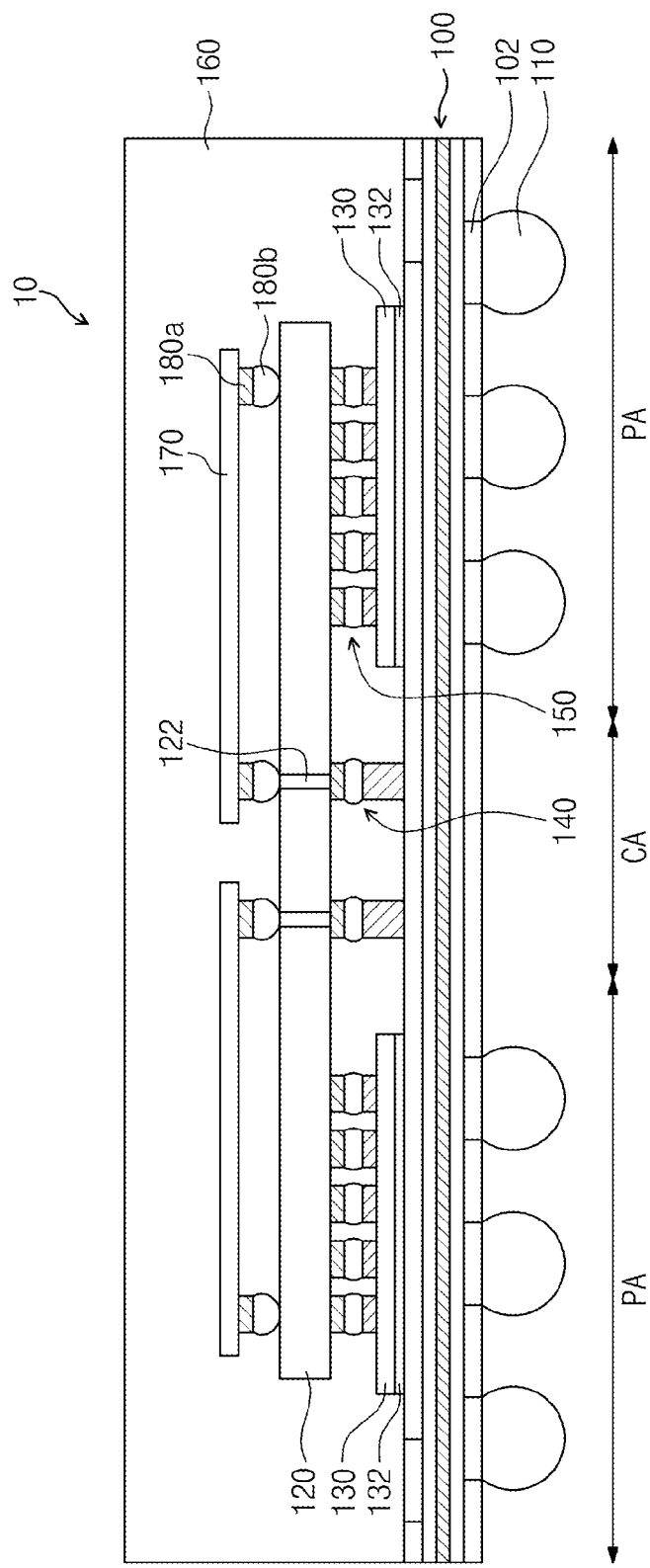
FIG. 5 is a cross-sectional view illustrating a semiconductor package according to even other example embodiments of the inventive concept.

FIG. 4 is a cross-cross-sectional view illustrating a semiconductor package according to still other example embodiments of the inventive concept, and FIG. 5 is a cross-cross-sectional view illustrating a semiconductor package according to other example embodiments of the inventive concept.

Referring to FIGS. 4 and 5, the semiconductor package 10 may include the package substrate 100, the first semiconductor chip 120, the second semiconductor chip 130, a third semiconductor chip 170 and the connection structures 140 and 150.

The package substrate 100, the first semiconductor chip 120, and the second semiconductor chip 130 and the first and second connection patterns 140 and 150 may be configured to have substantially the same structure and function as that of the previous embodiment described with reference to FIGS. 1 through 3. In describing the structures shown in FIGS. 4 and 5, the same reference numerals as shown in FIGS. 1-3 denote identical or similar elements, and repeated descriptions with respect to FIGS. 1-3 are omitted to avoid redundancy. In addition, as shown in FIGS. 4 and 5, the first and second connection patterns 140 and 150 may be configured to have the same features as those shown in FIG. 2, but they may be replaced with those shown in FIG. 3.

The third semiconductor chip 170 may be disposed on the other side of the first semiconductor chip 120 opposite the package substrate 100. In example embodiments, the third semiconductor chip 170 may be disposed spaced apart from the first semiconductor chip 120. Example embodiments of the inventive concept may not be limited to the above example of the present embodiments, in which the number of the third semiconductor chips 170 is two.

At least one through electrode 122 may be provided to penetrate the first semiconductor chip 120. In example embodiments, the number of the through electrode 122 may be two or more.

According to example embodiments of the inventive concept shown in FIG. 4, the through electrodes 122 may be formed on the peripheral region PA of the package substrate 100. At least one of the through electrodes 122 may be electrically connected to the corresponding one of the second connection patterns 150. Further, the through electrode 122 may be electrically connected to the third semiconductor chip 170. For example, a fifth conductive post 180a and a third bump 180b may be provided between the first semiconductor chip 120 and the third semiconductor chip 170 to electrically connect the second and third semiconductor chips 130 and 170 with each other. The third bump 180b may be electrically connected to the through electrode 122, and the third semiconductor chip 170 may be electrically connected to the second semiconductor chip 130.

According to other example embodiments of the inventive concept shown in FIG. 5, the through electrode 122 may be provided on the central region CA of the package substrate 100. The through electrode 122 may be electrically connected to the first connection pattern 140. Further, the through electrode 122 may be electrically connected to the third semiconductor chip 170. For example, the fifth conductive post 180a and the third bump 180b may be provided between the first and third semiconductor chips 120 and 170 to connect electrically the first and third semiconductor chips 120 and 170 with each other. The third bump 180b may be electrically connected to the through electrode 122, and the third semiconductor chip 170 may be electrically connected to the first semiconductor chip 120.

Example embodiments of the inventive concept may not be limited to the structure and the number, shown in FIGS. 4 and 5, of the through electrode 122, and the inventive concept may be variously modified in terms of structure and the number of the through electrode 122.

[Semiconductor Devices]

Figure 6:
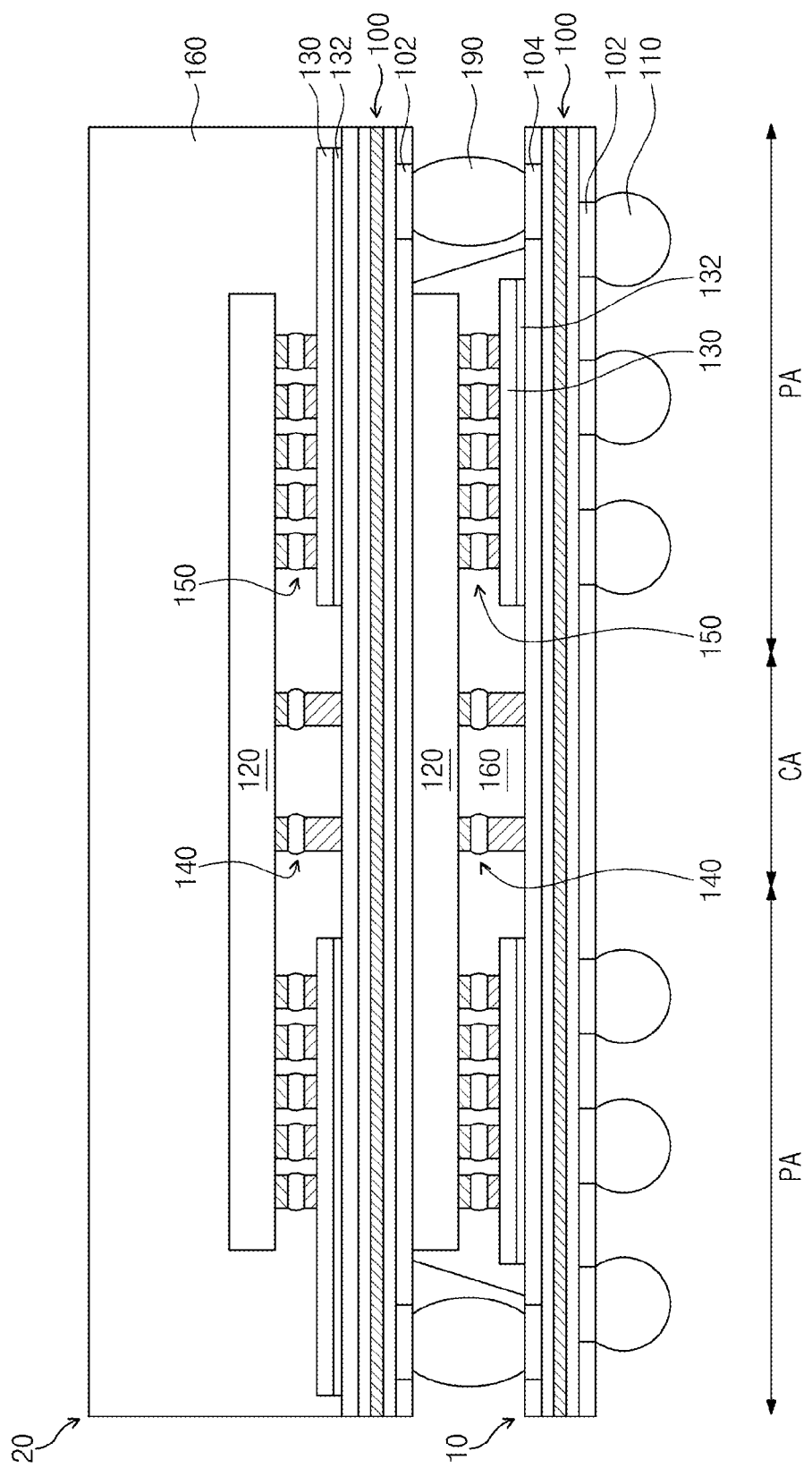
FIG. 6 is a cross-sectional view illustrating a semiconductor device according to example embodiments of the inventive concept.
Figure 7:
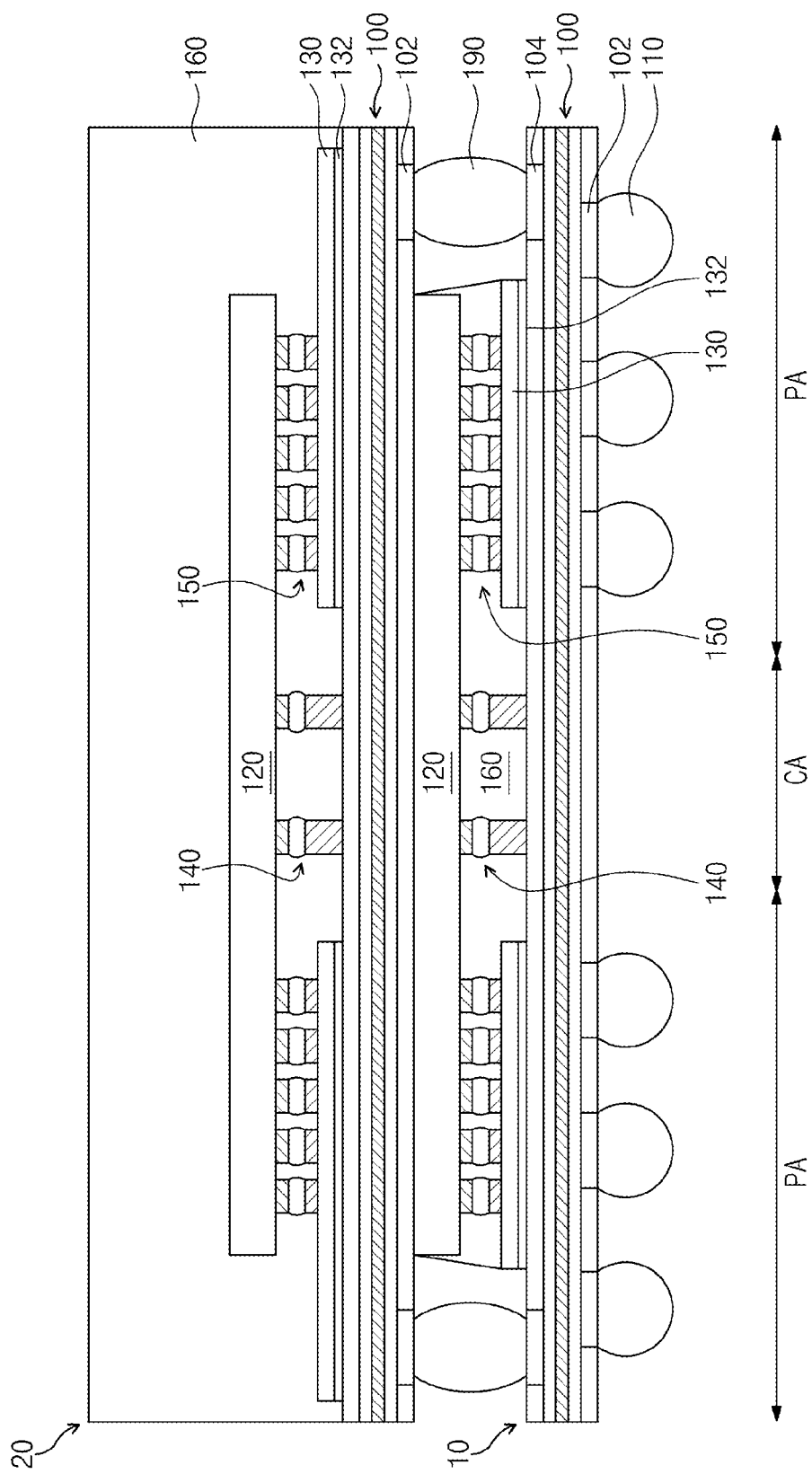
FIG. 7 is a cross-sectional view illustrating a semiconductor device according to other example embodiments of the inventive concept.

FIG. 6 is a cross-sectional view illustrating a semiconductor device according to example embodiments of the inventive concept, and FIG. 7 is a cross-cross-sectional view illustrating a semiconductor device according to some embodiments of the inventive concept.

Referring to FIGS. 6 and 7, the semiconductor device may include the first semiconductor package 10, a second semiconductor package 20 provided on the first semiconductor package 10, and a connecting portion 190 connecting the first and second semiconductor packages 10 and 20. As shown, the first and second semiconductor packages 10 and 20 may be provided in the form of a stacked structure to increase an integration density.

At least one of the first and second semiconductor packages 10 and 20 may include the package substrate 100, the first and second semiconductor chips 120 and 130, and the first and second connection patterns 140 and 150. The first connection pattern 140 electrically connects the package substrate 100 with the first semiconductor chip 120 and the second connection pattern 150 electrically interconnects the first semiconductor chip 120 and the second semiconductor chip 130. At least one of the first and second semiconductor packages 10 and 20 may have substantially the same structure as the semiconductor package 10 described with reference to FIGS. 1 through 3. Therefore, the same reference numerals as shown in FIGS. 1-3 denote identical or similar elements, and repeated descriptions with respect to FIGS. 1-3 are omitted to avoid redundancy.

The connecting portion 190 may connect the first semiconductor package 10 with the second semiconductor package 20. For example, the connecting portion 190 may be provided on the peripheral region PA of the package substrate 100 and be connected to a pad 104, which may be formed on the package substrate 100 to electrically connect the first and second semiconductor packages 10 and 20 with each other. In some embodiments, the connecting portion 190 may be, for example, a solder ball.

According to some embodiments of the inventive concept shown in FIG. 6, the protection element 160 of the first semiconductor package 10 may be a molding compound. For example, the protection element 160 may be formed using a molding process (e.g., a transfer molding process) inserting the package substrate 100 provided with the first and second semiconductor chips 120 and 130 and the first and second connection patterns 140 and 150 into a molding cast provided with a mold material. The protection element 160 may be formed to cover fully side surfaces of the first and second semiconductor chips 120 and 130. In example embodiments, the protection element 160 may be of an exposure mold type or be formed to expose the top surface of the first semiconductor chip 120.

According to some other embodiments of the inventive concept shown in FIG. 7, the protection element 160 of the second semiconductor package 20 may be an under-fill layer. For example, the protection element 160 may be formed by filling a gap region between the first and second semiconductor chips 120 and 130 with an under-fill material. The protection element 160 may cover the side surface of the first semiconductor chip 120 and expose the side surface of the second semiconductor chip 130.

[Methods of Fabricating a Semiconductor Package]

FIGS. 8A through 8E are cross-cross-sectional views illustrating a fabrication method of a semiconductor package according to one embodiment of the inventive concept.

Hereinafter, to maintain consistency in naming and reference numerals of elements, the terms of "first" to "fourth" may be changed from those of the elements described with reference to FIGS. 1 through 3.

Referring to FIG. 8A, a second conductive post 140c with a first bump 140b thereon, a fourth conductive post 150c with a second bump 150b thereon may be formed on a surface of a first semiconductor chip 120, and a third conductive post 150a may be formed on a surface of a second semiconductor chip 130.

Although not shown in detail, the formation of the first and second semiconductor chips 120 and 130 may include a redistribution process. In other words, chip pads of the first and second semiconductor chips 120 and 130 may be connected with redistribution patterns to rearrange bonding pads of first and second semiconductor chips 120 and 130. The second to fourth conductive posts 140c, 150a, and 150c may be formed using a plating process. According to some aspects of the inventive concept, the second to fourth conductive posts 140c, 150a, and 150c may include a layer of copper.

Referring to FIG. 8B, a first conductive post 140a may be formed on a package substrate 100. The first conductive post 140a may be formed using a plating process. According to some aspects of the inventive concept, the first conductive post 140a may include a layer of copper.

In example embodiments, the first conductive post 140a may be formed on the central region CA of the package substrate 100.

Referring to FIG. 8C, the second semiconductor chip 130 may be mounted on the package substrate 100. For example, the second semiconductor chip 130 may be attached to the package substrate 100 using an attaching element 132 (e.g., DAF) provided therebetween.

Although not illustrated, the first conductive post 140a may be formed on the package substrate 100 after mounting the second semiconductor chip 130 on the package substrate.

Referring to FIG. 8D, the first semiconductor chip 120 may be disposed over the package substrate 100. As described above, the first semiconductor chip 120 may include the second and fourth conductive posts 140c, 150c with the first and second bumps 140b and 150b thereon respectively, and when the first semiconductor chip 120 is disposed over the package substrate 100, the first bump 140b and the second conductive post 140c may be electrically connected to the first conductive post 140a. Also, the second bump 150b and the fourth conductive post 150c may be electrically connected to the third conductive post 150a.

As a result, it is possible to electrically connect the package substrate 100 to the first semiconductor chip 120 and to electrically connect the first semiconductor chip 120 to the second semiconductor chip 130.

Figure 8E:
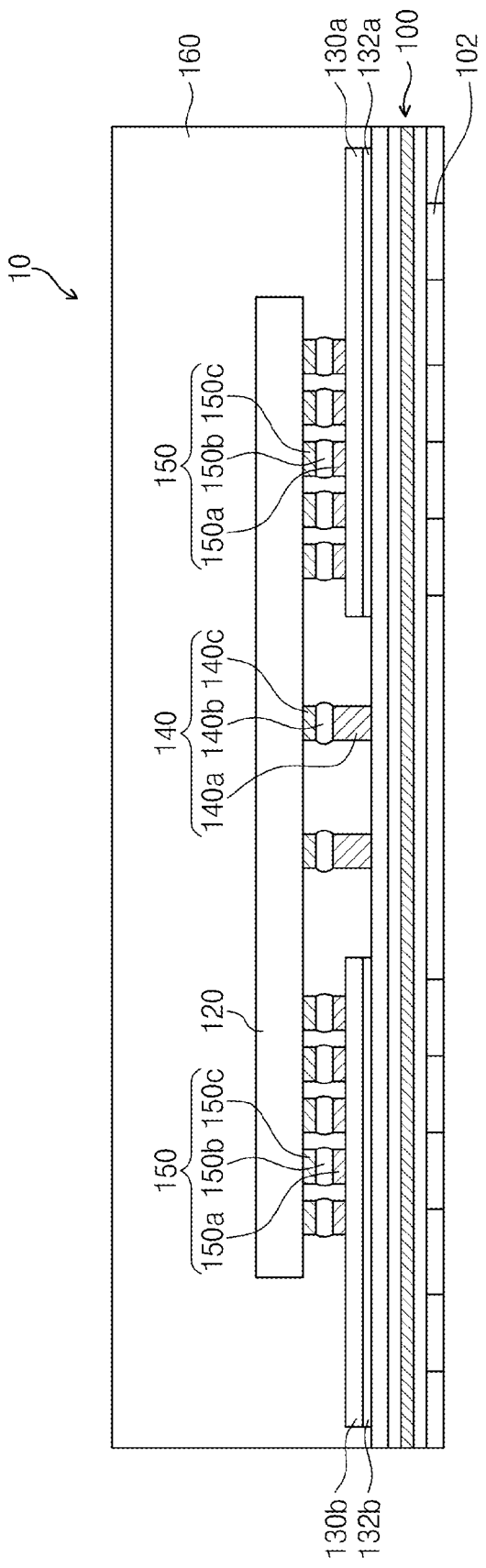

Referring to FIG. 8E, a protection element 160 may be formed to cover or encapsulate the package substrate 100 and the first and second semiconductor chips 120 and 130.

FIGS. 9A through 9D are cross-cross-sectional views illustrating a fabrication method of a semiconductor package according to another embodiment of the inventive concept. In this embodiment, the first bump 140b and the second bump 150b are formed on the first conductive post 140 and the third conductive post 150a, respectively, before they form the first and second conductive patterns 140, 150, respectively, as shown in FIG. 9D.

[Application]

Figure 10A:
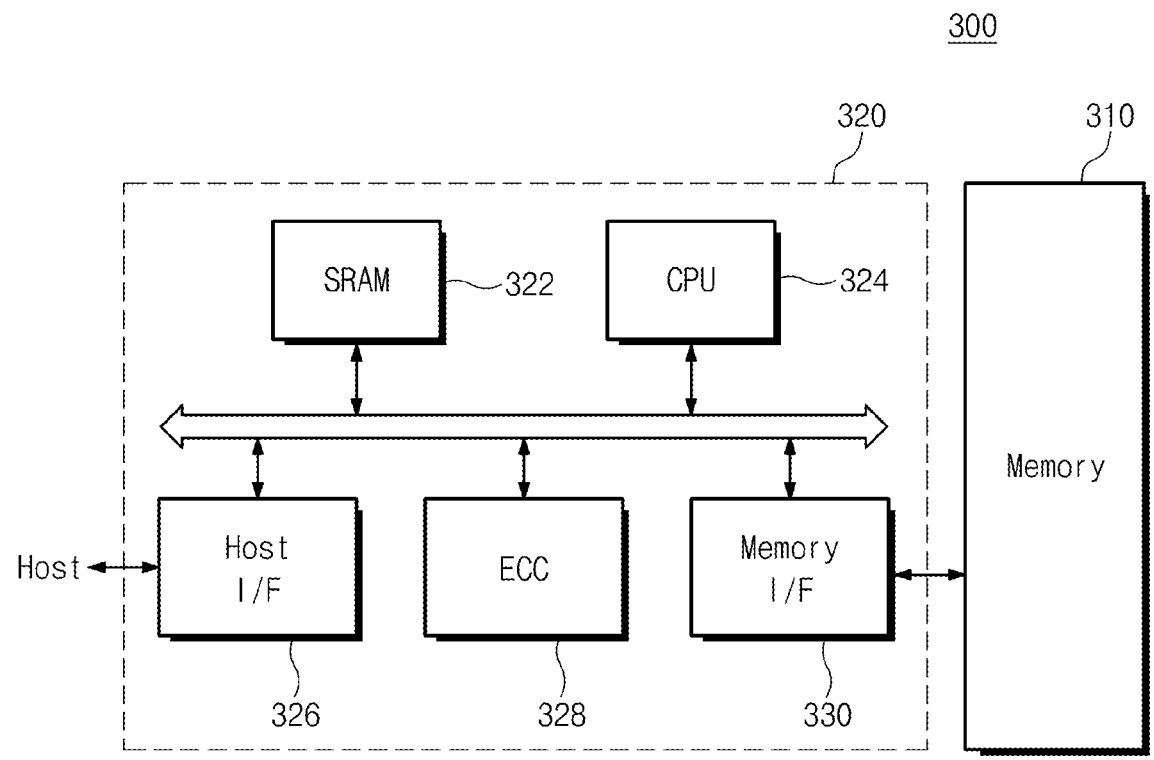
FIG. 10A is a block diagram illustrating a memory card including a semiconductor package according to example embodiments of the inventive concept.

FIG. 10A is a block diagram illustrating a memory card including a semiconductor package according to example embodiments of the inventive concept.

Referring to FIG. 10A, a semiconductor device according to exemplary embodiments of the inventive concept may be applied to form a memory card 300. The memory card 300 may include a memory controller 320 to control a data exchange between a host and a memory device 310. A static random access memory 322 may be used as an operation memory of a central processing unit 324. A host interface 326 may include at least one data exchange protocol of the host connected to the memory card 300. An error correction code 328 may detect and correct at least one error that may be included in data read from the memory device 310. A memory interface 330 can interface with the memory device 310. The central processing unit 324 can control data exchange of the memory controller 320 with, for example, the memory device 310.

The memory device 310 in the memory card 300 may be the semiconductor device according to the exemplary embodiments of the inventive concept. In this case, it is possible to increase a degree of freedom in designing a size of semiconductor chip, to increase a density of memory cells, and to improve an integration density of the semiconductor device.

Figure 10B:
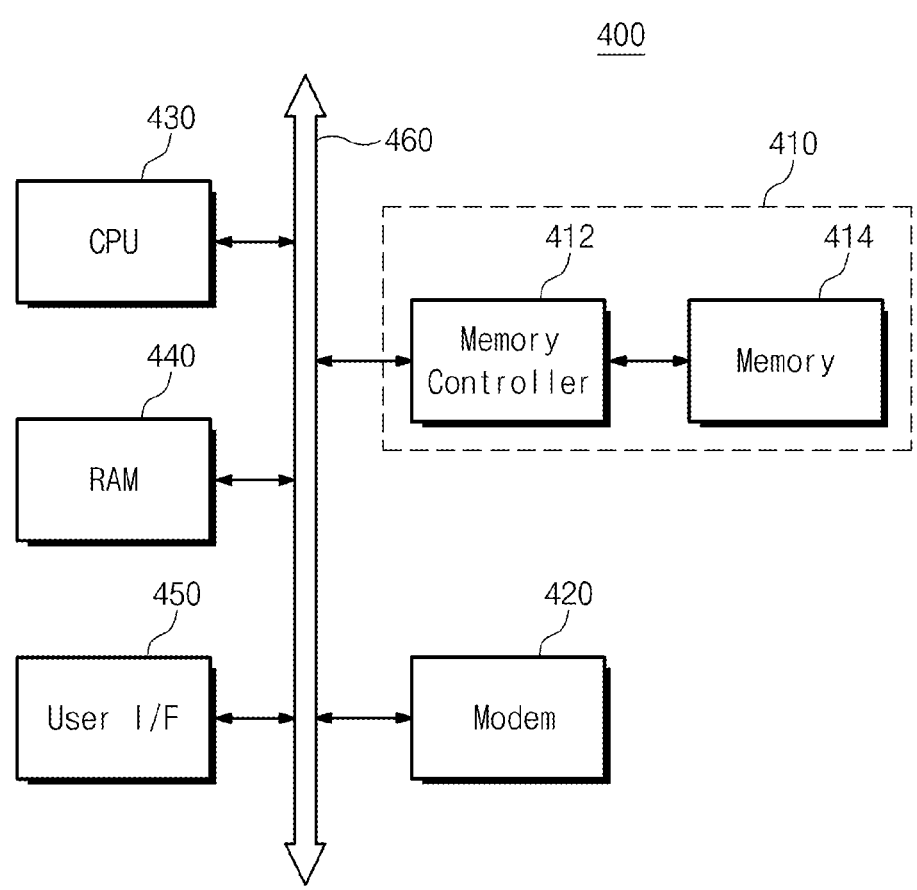
FIG. 10B is a block diagram illustrating an information processing system including a semiconductor package according to example embodiments of the inventive concept.

FIG.10B is a block diagram illustrating an information processing system including a semiconductor package according to example embodiments of the inventive concept.

Referring to FIG.10B, an information processing system 400 may include a semiconductor device according to exemplary embodiments of the inventive concept. The information processing system 400 may include a mobile device or a computer such as a laptop computer or a tablet PC. As an illustration, the information processing system 400 may include the memory system 410, a modem 420, a central processing unit (CPU) 430, a random access memory (RAM) 440, and a user interface 450 electrically connected to a system bus 460. The memory system 410 may store data processed by the central processing unit (CPU) 430 and data inputted from the outside (e.g., via the user interface 450 and/or the modem 420). The memory system 410 may include a memory 412 and a memory controller 414. The memory system 410 may be the same as the memory card 300 described with reference to FIG. 9A. The information processing system 400 may be provided as a memory card, a solid state disk, a camera image sensor and an application chip set. For example, the memory system 410 may be a solid state disk (SSD). The information processing system 400 may stably and reliably store data in the memory system 410.

According to example embodiments of the inventive concept, a slave chip may be electrically connected to a package substrate via a master chip. This increases a density of memory cells and further a speed of a semiconductor package. In addition, the master chip may be electrically connected to a central region of the package substrate via a first connection pattern, and thus, it is possible to increase a degree of freedom in designing the size of the slave chip.

While example embodiments of the inventive concepts have been particularly shown and described, it will be understood by one of ordinary skill in the art that variations in form and detail may be made therein without departing from the spirit and scope of the attached claims.

What is claimed is:

1. A semiconductor package, comprising:
a package substrate including a central region and a peripheral region;
a first semiconductor chip on the package substrate;
a first connection pattern on the central region of the package substrate to electrically connect the package substrate to the first semiconductor chip;
at least one second semiconductor chip on the peripheral region of the package substrate and between the package substrate and the first semiconductor chip; and
a second connection pattern on the peripheral region of the package substrate to electrically connect the first semiconductor chip to the second semiconductor chip.

2. The semiconductor package of claim 1, wherein the first connection pattern includes:
a first conductive post on the package substrate;
a second conductive post on the first semiconductor chip; and
a first bump between the first and second conductive posts.

3. The semiconductor package of claim 2, wherein the first conductive post has a thickness substantially equivalent to or greater than a thickness of the second conductive post.

4. The semiconductor package of claim 2, wherein the second connection pattern includes:
a third conductive post on the first semiconductor chip;
a fourth conductive post on the second semiconductor chip; and
a second bump between the third and fourth conductive posts.

5. The semiconductor package of claim 4, wherein the first conductive post has a top surface substantially coplanar with a top surface of the third conductive post.

6. The semiconductor package of claim 4, wherein the first bump is provided at substantially the same level as that of the second bump and has substantially the same shape as that of the second bump.

7. The semiconductor package of claim 1, wherein the at least one second semiconductor chip includes a plurality of second semiconductor chips, which are horizontally spaced apart from each other, and at least one of which is provided on the peripheral region of the package substrate.

8. The semiconductor package of claim 1, further comprising:
a third semiconductor chip on the first semiconductor chip; and
a third connection pattern electrically connecting the first semiconductor chip with the third semiconductor chip.

9. The semiconductor package of claim 8, wherein the first semiconductor chip includes a through electrode, which penetrates the first semiconductor chip to electrically connect the second connection pattern with the third connection pattern.

10. The semiconductor package of claim 8, wherein the first semiconductor chip includes a through electrode, which penetrates the first semiconductor chip to electrically connect the first connection pattern with the third connection pattern.

11. A semiconductor device, comprising:
a first semiconductor package including a first package substrate, a first master chip connected to the first package substrate via a first connection pattern, and a first slave chip between the first package substrate and the first master chip and connected to the first master chip via a second connection pattern;
a second semiconductor package including a second package substrate, a second master chip connected to the second package substrate via a third connection pattern, and a second slave chip between the second package substrate and the second master chip and connected to the second master chip via a fourth connection pattern; and
a connecting portion electrically connecting the first semiconductor package with the second semiconductor package.

12. The device of claim 11, wherein the first connection pattern is provided on a central region of the first package substrate,
the second connection pattern is provided on a peripheral region of the first package substrate,
the third connection pattern is provided on a central region of the second package substrate, and
the fourth connection pattern is provided on a peripheral region of the second package substrate.

13. The device of claim 11, wherein at least one of the first and third connection patterns includes:
a first conductive post on the first or second package substrate;
a second conductive post on the first or second master chip; and
a bump between the first and second conductive posts.

* * * * *